United States Patent
Worm et al.

[11] Patent Number: 5,930,416
[45] Date of Patent: Jul. 27, 1999

[54] AMBIENT LIGHT AND DUST PROTECTION FOR A MECHANICALLY OPERATED OPTICAL SWITCH

[75] Inventors: Steven L. Worm, Raleigh; Jackie C. Sullivan, Knightdale, both of N.C.

[73] Assignee: Square D Company, Palatine, Ill.

[21] Appl. No.: 08/958,363

[22] Filed: Oct. 27, 1997

Related U.S. Application Data

[63] Continuation-in-part of application No. 08/619,865, Mar. 19, 1996, Pat. No. 5,682,259.

[51] Int. Cl.$^6$ .............................. G02B 6/26; H04B 10/00; G08B 5/36
[52] U.S. Cl. ................................ 385/16; 385/15; 385/25; 385/147; 359/163; 340/815.48; 340/815.5; 340/815.74; 340/815.76
[58] Field of Search .................................. 385/15, 16, 18, 385/25, 147, 33; 359/163, 135; 340/815.48, 815.5, 815.74, 815.76; 250/227.11; 307/117, 119, 125; 361/718

[56] References Cited

U.S. PATENT DOCUMENTS

| | | | |
|---|---|---|---|
| 3,856,127 | 12/1974 | Halfton et al. | 385/16 X |
| 3,886,544 | 5/1975 | Narodny | 385/16 X |
| 4,437,728 | 3/1984 | Ohashi | 385/25 X |
| 4,878,722 | 11/1989 | Nelson et al. | 385/16 X |
| 5,133,030 | 7/1992 | Lee | 385/19 |
| 5,525,846 | 6/1996 | Newell et al. | 307/125 |
| 5,682,259 | 10/1997 | Worm et al. | 359/163 |

*Primary Examiner*—Brian Healy
*Attorney, Agent, or Firm*—David R. Stacey; Lawrence I. Golden

[57] ABSTRACT

An optical switch operating mechanism including a housing cooperatively preventing dust and light from easily reaching an optical switch supported within the housing. The housing includes integrally formed spaced apart slots for receiving the optical switch and an associated integrally formed tubular shaft for slidably receiving a switch operator, a portion of which extends outside the housing. The tubular shaft is positioned between the spaced apart slots such that the longitudinal axes of the shaft and it's associated pair of slots and are perpendicular to one another. A light passage, also integrally formed with the pair of slots and associated shaft, passes through the shaft connecting the associated pair of slots such that light from the optical switch emitter can be received by the optical switch receiver when a window in the switch operator is aligned with the light passage. The snug fit of the switch operator in the tubular shaft combined with the perpendicular alignment of the light passages with the shaft prevents any light or dust which might fall on that portion of the housing from which the switch operator extends from having a direct path to the optical switch. A circumferential flange integrally formed from an enclosed end of the switch operator and snugly received within an integrally formed extension of the housing prevents light and dust entering through an actuator access aperture in the housing from reaching the optical switch.

5 Claims, 4 Drawing Sheets

AMBIENT LIGHT AND DUST PROTECTION FOR A MECHANICALLY OPERATED OPTICAL SWITCH

This application is a continuation-in-part of application Ser. No. 08/619,865 filed Mar. 19, 1996, now U.S. Pat. No. 5,682,259.

FIELD OF THE INVENTION

This invention relates to mechanically operated optical switches and particularly to ambient light and dust protection for optical switches.

BACKGROUND OF THE INVENTION

Systems for remotely controlling electrical devices from a manual control panel are well known. In some systems employing point-to-point input/output, or I/O, architecture, each of a plurality of manually activated operator interface devices, such as a push button, a key operator, a joy stick, or a rotary selector may be used to operate an associated contact block having one or more electrical contacts. Each contact block is electrically connected to an associated remotely located output device, such as a pilot light, a contractor, an overload relay or other electrically controllable device. These individual point-to-point connections between each contact block and its associated output device causes the task of making a manual control panel assembly extremely labor intensive and costly.

In order to reduce the labor costs as well as the cost of materials, it is now known to construct manual control panel assemblies wherein a number of operator interface controlled contact blocks are connected to a number of remotely located output devices by a single time division multiplexing communications link shared by all of the input and output modules of the system. In this system each contact block is electrically connected to an associated input access module which provides access to the multiplexing communications link over which the status of that particular contact block is conveyed to an associated output access control module. The output access control module is electrically connected to an associated output device which is ultimately controlled by the associated operator interface device at the control panel. This mode of operation is herein defined as the STAND-ALONE-MODE or PEER-TO-PEER mode where one contact block and its associated input access module sends a signal directly to its associated output access module for controlling the associated output device. This system could also be used in a HOST mode where the signal from the input access module is sent to a computer or other device having a CPU or means for adding simple logic functions such as AND, NAND, OR or NOR to the signal. A control system employing a time division multiplex common communication link is shown and described in U.S. Pat. No. 4,808,994 issued on Feb. 28, 1989 to Riley for "Logic Interchange System" and in the improvement patent application Ser. No. 08/099,788 filed Jul. 30, 1993 assigned to the assignee of the present invention and incorporated herein by reference. In this type of system, both the input and output access modules contain a communications circuit for communicating on the time division multiplexed common communications link and a circuit for implementing basic logic functions such as AND, NAND, OR and NOR. Because the logic circuit is included in each of the input and output access modules the system can operate in either the STAND-ALONE-MODE or the HOST mode. The state of the contact block is received by the input access module where it is processed and passed onto the communications link in the proper time slot to be received by the associated output access module. The output access module interprets the signal and passes the appropriate signal on to the output device for action.

It is also known to convey contact block status information between a number of input access modules and their associated output access modules via network signaling. An example of such a network signaling control system is the LonWorks system which is assembled from components manufactured by Echelon Company of Palo Alto, Calif. The LonWorks system also comprises an ASIC which produces the signals for the network and may also be programmed with software to produce the basic logic functions of AND, NAND, OR and NOR.

The use of either of these two types of distributed I/O architecture will eliminate the point-to-point wiring between each contact block and its associated output device. However, in the current state of the art, a point-to-point connection is still required between the contact block and some type of input access module associated with the contact block and between the output device and some type of output access module associated with the output device. Each connection between an access module and a contact block or output device requires at least two separate wires and sometimes more. In control panel construction the operator interface device is installed on the outside of the panel cover and the contact block is on the inside of the panel cover. The operator interface device and contact block are in communication with each other such that manually operating the operator interface device will change the state of the electrical contacts within the contact block. The input access module is generally placed at an easily accessible location inside the control panel such as the back wall of the panel enclosure. This is usually some distance away from the contact block. It is also common for a control panel to include a number of pilot lights, each indicating the status of an associated output device controlled by its associated operator interface device. These pilot lights are actually output devices and therefore require a connection to the common communications link. Each pilot light requires a separate output access module and wiring between the output access module and the pilot light. The wiring between the contact blocks, pilot lights and their associated input and output access module must be of sufficient length to permit cover removal when inspection, maintenance or trouble shooting is required. This generally requires several feet of wire for each connection. Control panels which have a large number of operator interface devices and pilot lights are difficult to wire and assemble due to the many wires required. Thus, even with the common communication link between input access modules and output access modules the control panel itself still requires considerable wiring time and material. The physical size of the control panel enclosure is also a consideration. For each contact block and pilot light in the control panel, one input or output access module is required. The input and output access modules are at least the same size as the contact blocks and pilot lights and in many cases much larger. Therefore the volume of the control panel must be of sufficient size to enclose all of the input and output access modules and the wire required for connecting them to their respective contact blocks and pilot lights. In U.S. Pat. No. 5,525,846, which issued Jun. 11, 1996, and is assigned to the present assignee and incorporated herein by reference, this was simplified by incorporating the logic and communications circuits of the input module and output module into the contact module and pilot light module.

However, this still required the assembly and wiring of two modules, one pilot light module and at least one contact module, to produce an illuminated switch (see FIG. 1).

SUMMARY OF THE INVENTION

It is an objective of this invention to provide an integrated pilot light/contact/communications module which will greatly reduces the labor intensive wiring and assembly problems associated with control panels employing conventional contact blocks, pilot light assemblies, input access modules and output access modules, while, at the same time, making trouble shooting and maintenance of the control panel easier.

It is also an object of this invention to reduce the number of electrical circuits required for the system by approximately one half thus permitting the complete integrated pilot light/contact/communications module to be approximately the same size as a pilot light module of the previous systems. This objective will permit the integrated pilot light/contact/communications modules to be used with existing devices and as direct replacement for existing devices without requiring additional labor and components.

The objects of the invention are achieved by providing a manually actuatable integrated pilot light/contact/communications module comprising a housing; a printed circuit board enclosed within the housing; at least one electrical contact selectively movable between an open state and a closed state and electrically connected to the printed circuit board, means for manually changing the state of the contact, the means being partially enclosed within the housing; a logic circuit in electrical communication with the contact for providing a logical function in response to the change of state of the contact; a communications circuit in electrical communication with the logic circuit for producing a signal in response to the logic circuit; a communications terminal in electrical communication with the communications circuit for providing an external connection to a bi-directional communications link; a pilot light activation circuit located on the printed circuit board; a pilot light mounted to the housing and in electrical communication with the pilot light activation circuit; means for attaching the integrated contact module to an operator interface device; and status indicating LED's visible from the rear of the module housing.

It is also preferable that the integrated pilot light/contact/communications module include a second contact having a normal state opposite that of the first contact and that the second contact be in electrical communication with a second logic circuit which in turn is in electrical communication with the communications circuit which provides a signal in response to the state of the second contact to the communications terminal.

The integrated pilot light/contact/communications module of the present invention further includes a group of status indicating LED's viewable from the rear of the of the module. These LED' indicate "POWER ON", status of a first electrical contact, status of a second electrical contact and status of the pilot light. This facilitates trouble shooting of a control panel by allowing the repair person to easily see the status of each operator interface device and output device from the rear of the control panel.

A further aspect of the invention is to prevent dust and ambient light, inherent to the industrial environment, from causing a malfunction in an integrated module of the present invention employing optical switches.

Other features and advantages of the invention will become apparent to those skilled in the art upon review of the following detailed description, claims and drawings.

Figure 1:
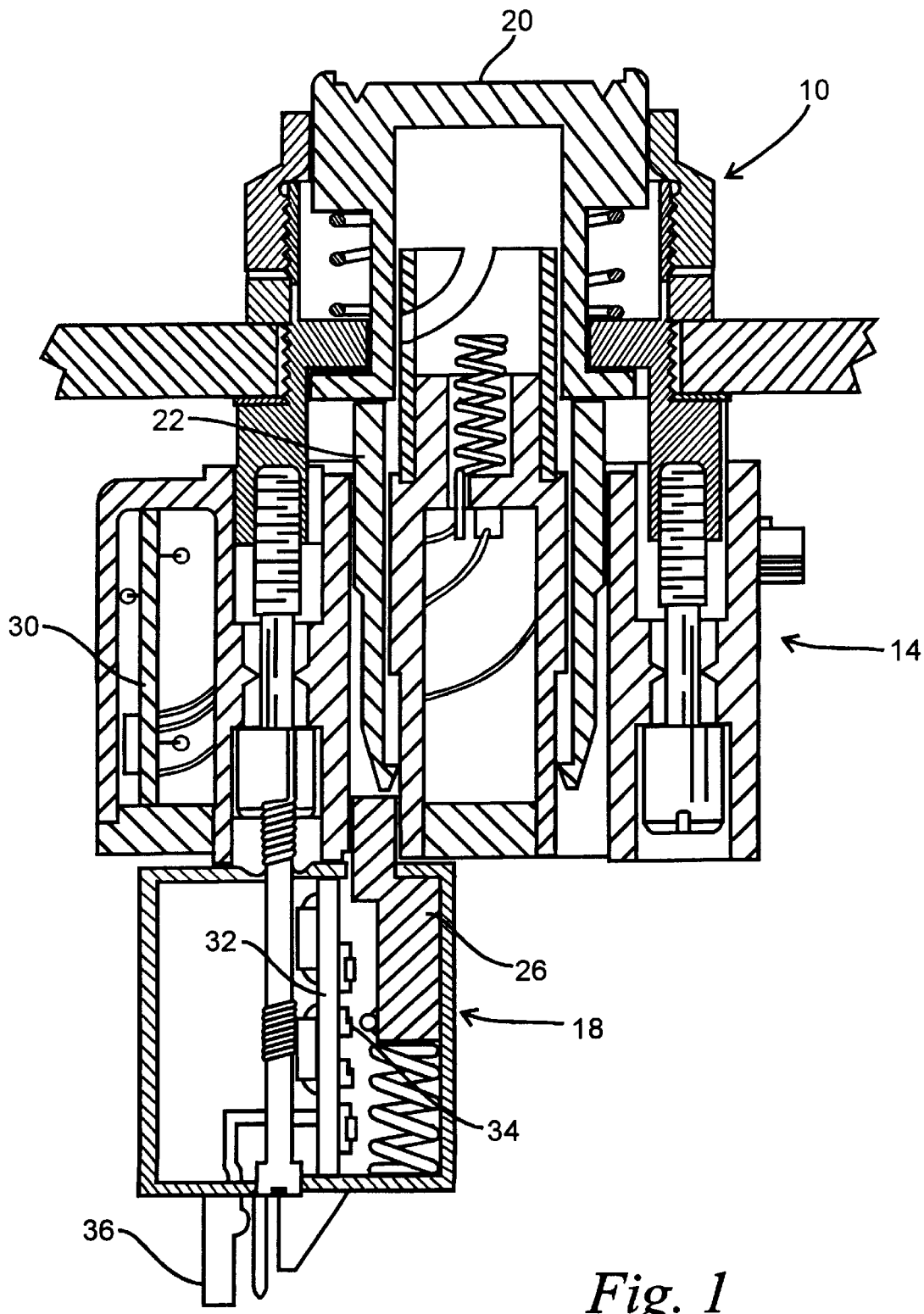
FIG. 1 is a cross-sectional view of a push button operator having a pilot light module and a switch/communications module attached.

Before one embodiment of the invention is explained in detail, it is to be understood that the invent ion is not limited in its application to the details of construction and description or illustrated in the drawings. The invention is capable of other embodiments and of being practiced or being carried out in various other ways. Also, it is to be understood that the phraseology and terminology used herein is for the purpose of description and should not be regarded as limiting.

DESCRIPTION OF THE PREFERRED EMBODIMENT

Referring to FIG. 1, an operator interface 10 (push button), integrated pilot light module 14 and integrated contact block 18 as described in U.S. patent application Ser. No. 08/282,839, now U.S. Pat. No. 5,525,846 are illustrated. The pilot light module 14 is connected directly to the operator interface device 10 thus permitting the pilot light to be seen through a lens 20 in the operator interface 10. The integrated contact module 18 is attached to the back side of the integrated pilot light module 14 such that translation pins 22 in the pilot light module 14 can transfer the movement of the operator interface 10 to a contact operator 26 in the integrated contact module 18. The integrated pilot light module 14 includes a printed circuit board 30 on which a logic circuit, a communications circuit and a pilot light activation circuit for activating the pilot light are located. The integrated contact module 18 includes a printed circuit board 32 on which a logic circuit, a communications circuit and at least one contact 34 are located. The contact 34 changes state as the contact operator 26 moves in response to movement of translation pin 22 initiated by the operator interface device 10. A communications terminal 36 is attached to both boards 30 and 32 (not shown on board 30) for connecting to a bi-directional communications link.

Figure 2:
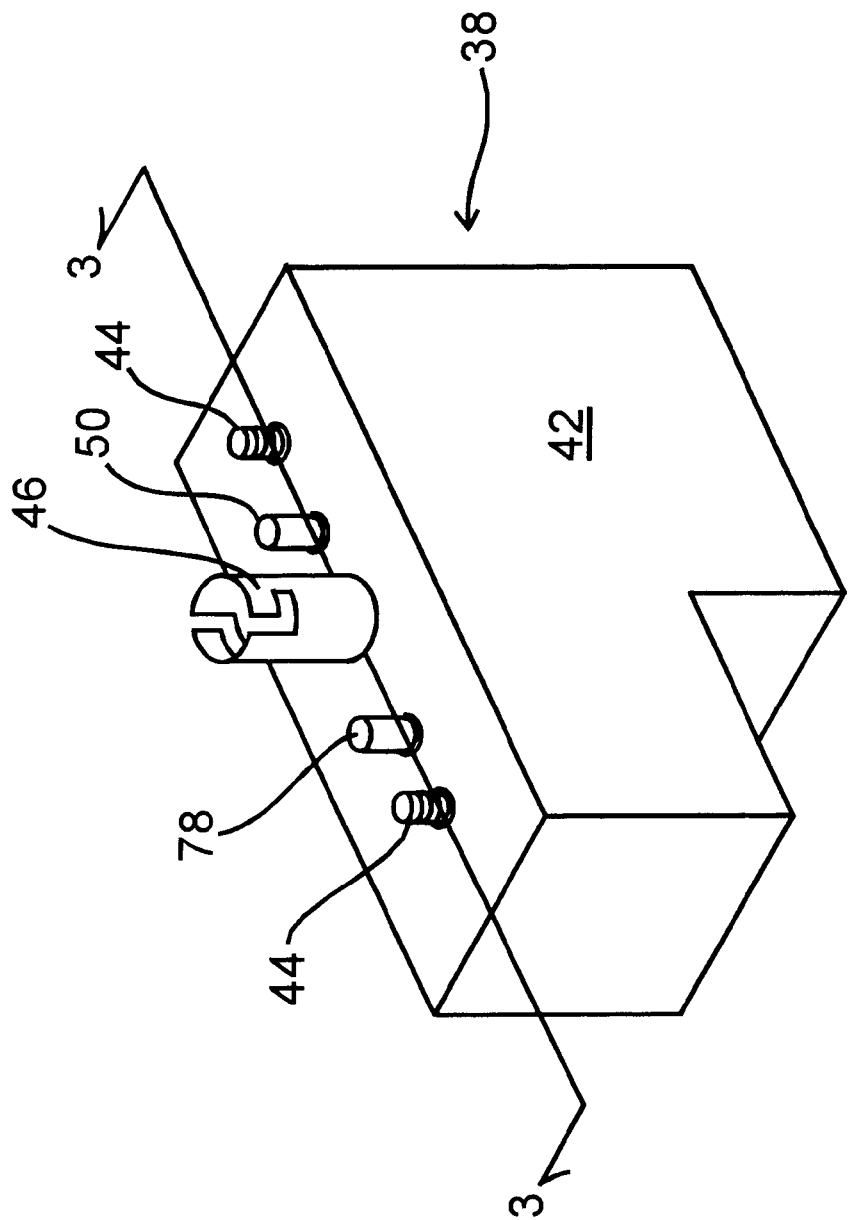
FIG. 2 is an isometric of an integrated pilot light/contact/communications module in accordance with the present invention.

FIG. 2 illustrates the manually actuatable integrated pilot light/contact/communications module of the present invention, generally indicated by the reference numeral 38. The integrated module 38 includes a generally rectangular housing 42 which is provided with screws 44 for attaching to an operator interface 10 of FIG. 1. A bulb base 46 for receiving an illuminating device such as an incandescent bulb or LED cluster is attached to the housing 42. At least one translation pin 50 is provided. The translation pin 50 has a first end 51 located inside the housing an a second end 52 located outside the housing 42 for interaction with the operator interface device 10. The second end 52 can be used to translate movement of an operator interface device (not shown) to a contact block (not shown) through an aperture 53 located in the back of the housing 42. An auxiliary integrated contact module 18 may be used in place of the contact block if a second network is monitoring the operator interface device 10. These auxiliary contacts are attached to the back of the housing 42. In other pilot light modules such as pilot light module 14 of FIG. 1, the translation pins 22 are loosely maintained within the pilot light module housing and function only as a means for translating movement of the operator interface device 10 through the pilot light module 14 to the integrated contact module 18.

Figure 3:
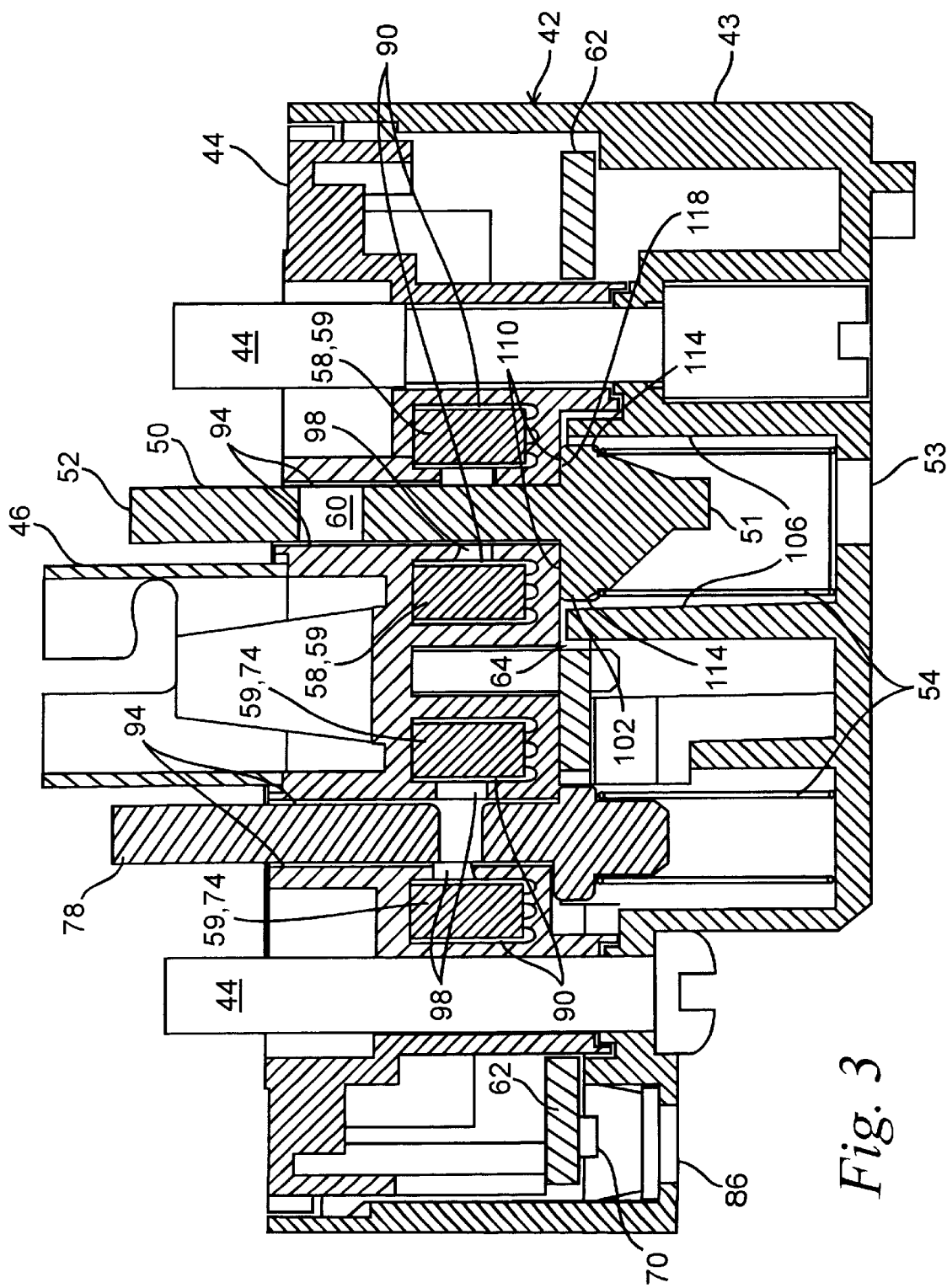
FIG. 3 is a cross-sectional view taken along line 3—3 of FIG. 2 of an integrated pilot light/contact/communications module in accordance with the present invention.

Referring now to FIG. 3, it can be seen that the translation pin 50 of the present invention is normally biased to a first position by a spring 54 and provides the means for changing the state of a contact 58 located adjacent the translation pin 50 as the translation pin 50 is selectively moved to a second position. The contact 58 may be a mechanical operated, a magnetically operated or an optically operated switch. In the preferred embodiment the contact 58 is an optical switch as illustrated in FIG. 3 and which will be indicated by reference numeral 59 when the operation or characteristics are not generic to the other embodiments of contact 58. The optical switch 59 consists of matched optical pairs (one emitter and one receiver) enclosed within a molded case and commercially available from manufactures such as Sharp Electronics Corporation and Optek Technology Inc. The optical switch 59 is operated by a window 60 located in the translation pin 50. The window 60 is positioned in the translation pin 50 such that light from the optical switch emitter can pass through it to the optical switch receiver when the translation pin 50 is in one the first or second positions and is blocked by the translation pin 50 in the other of the first or second positions. A printed circuit board 62 is located inside the housing and is positioned such that its flat surface is generally perpendicular to the translation pin 50. The printed circuit board 62 to is provided with an aperture 64 for permitting the translation pin 50 to pass through the printed circuit board 62. Located on the printed circuit board 62 are a logic circuit, a communications circuit, a pilot light activation circuit, a communications terminal 66 (FIG. 4) and a group of status indicating LED's 70. The contact 58 can be located on the printed circuit board 62 or fixed to a portion of the housing structure guiding the translation pin 50. In either case the contact 58 is electrically connected to the logic circuit on the printed circuit board 62. The logic circuit provides a logical function in response the change of state of the contact 58. The logic circuit is connected to the communications circuit which produces a control signal in response to the logical function. The control signal is passed from the communications circuit to the communications terminal 66 and then to an associated remote output device over a bi-directional communications link. In this application the term communications link is defined as a bus including both data and power lines. The associated remote output device also includes a module having a logic circuit and a communications circuit which interprets the control signal and produces a signal indicating the state of the associated remote output device. The bulb base 46 is electrically connected to the pilot light activation circuit on the printed circuit board 62. The pilot light activation circuit is connected to the communications circuit such that the status signal from the associated remote output device will determine the "ON" or "OFF" state of the pilot light. Power for operating the pilot light is provided by the communications link. It is desirable for the integrated pilot light/contact/communications module 38 to include a second contact 74 having a normal state opposite the first contact 58. The preferred embodiment the second contact 74 is also an optical switch 59 as described above. The second contact 74 is operated by a second translation pin 78 and is connected to a second logic circuit located on the printed circuit board 62. Each of the translation pins, 50 and 78, includes means located at a predetermined position on the translation pins, 50 and 78, for activating the contacts 58 and 74. This means can include a nodule or ridge for operating a mechanically operated switch, a magnet for operating a magnetically operated switch or a window 60 for operating an optical switch 59.

Figure 4:
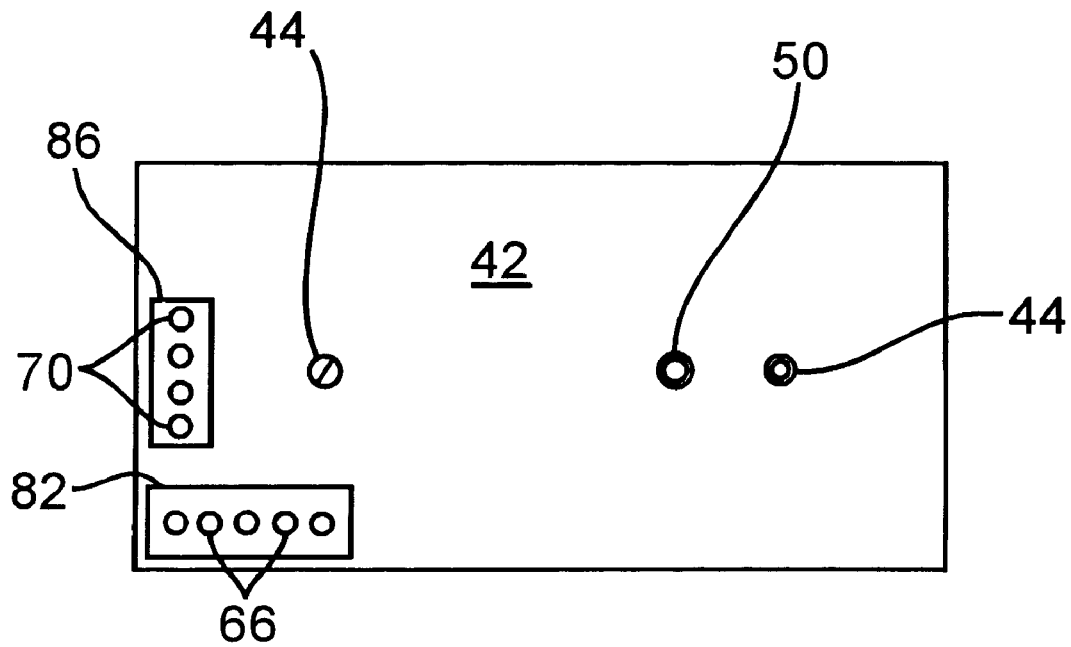
FIG. 4 is a view of the rear of the integrated pilot light/contact/communications module.

Referring now to FIG. 4, The communications terminal 66 is located on the printed circuit board 62 such that it can be accessed through an opening 82 in the back of the housing 42. The status indicating LED's 70 are positioned on the printed circuit board 62 such that can be viewed through an opening 86 in the back of the housing 42. The LED's indicate "POWER ON", status of the first contact 58, status of the second contact 74 and status of the pilot light.

Any device located in an industrial atmosphere is subject to dust and significant amounts of ambient light or direct light during routine maintenance, all of which can significantly affect the operation of an optical switch 59 as incorporated in the module 38 of the present invention. Therefore, the enclosure 42 and translation pin 50 have been designed to cooperatively prevent dust and light, either ambient or direct, from easily reaching the optical switch 59 through the aperture 53 in the back of the enclosure 42, or any other opening in the enclosure 42. Referring again to FIG. 3, it can be seen that the housing 42 consist of two parts, a box like bottom 43 having four sides and a back which define a generally open interior and a top 44 on which the bulb base 46 is installed and which supports the optical switches 59 and translation pins 50 and 78. The printed circuit board 62 is positioned between the bottom 43 and top 44. A pair of spaced apart slots 90 are defined in the top 44 for slidably receiving the emitter and receiver of each optical switch 59. Tubular shafts 94, dimensioned to snugly but slidably receive that portion of the translation pins, 50 and 78, containing the windows 60, are also defined by the top 44. The translation pins, 50 and 78, and tubular shafts 94 have complementary non-circular cross-sectional shapes which prevent the translation pins, 50 and 78, from rotating about their longitudinal axes in the shafts 94, thereby maintaining the windows 60 in a particular plane with respect to the slots 90. One shaft 94 is integrally formed between each pair of slots 90 such that the longitudinal axes of the slots 90 and associated shaft 94 are perpendicular to one another. A light passage 98, also integrally formed with the pair of slots 90 and associated shaft 94, passes through the shaft 94 connecting the associated pair of slots 90 such that light from the optical switch emitter can be received by the optical switch receiver when the window 60 of the associated translation pin, 50 or 78, is aligned with the light passage 98. The snug fit of the translation pins, 50 and 78, in the tubular shafts 94 combined with the perpendicular alignment of the light passages 98 with the shafts 94 prevents any light which might fall on the top 44 from having a direct path to the optical switch 59.

Translation pin 50, which is accessible from the back of the housing 42 through aperture 53, further defines an integrally formed circumferential flange 102 adjacent it's first end 51. The circumferential flange 102 has an outside diameter significantly greater than the cross-sectional dimension of tubular shaft 94 and the diameter of the aperture 53. The circumferential flange 102 is snugly received within a tubular extension 106 integrally formed from the bottom 43 of the housing 42. The tubular extension 106 generally surrounds the aperture 53 and extend upward into the generally open interior of the bottom 43 terminating immediately adjacent an inside surface 110 of the top 44. The inside surface 110 is generally flat and surrounds the inside end of the tubular shaft 94. That portion of the translation pin 50 between the circumferential flange 102 and the first end 51 is generally cone-like in cross-section and includes a narrow ledge 114 at the circumference of the circumferential flange 102 for engaging the biasing spring 54. The circumferential flange 102 has a generally flat upper surface 118 which faces the inside surface 110 of the top 44. The circumferential flange 102, having a diameter significantly greater than the cross-sectional dimension of the tubular shaft 94 and the diameter of the aperture 53, and being snugly received within the tubular extension 106 prevents any dust and light entering through the aperture 53 from reaching the optical switch 59. When the translation pin 50 is in its normally biased first position, the upper surface 118 of the circumferential flange 102 engages the inside surface 110 of the top 44, thus further preventing any dust or light entering through the aperture 53 from reaching the optical switch 59.

We claim:

1. A mechanical operator for an optical switch having light and dust resistant qualities, said operator comprising:
    a housing having a top and a bottom, said top defining a pair of spaced apart slots for receiving an emitter and a receiver of the optical switch and a generally tubular shaft passing between said pair of slots such that said longitudinal axes of said slots and said shaft are generally perpendicular to one another, said top further defining a light passage extending between said slots and through said shaft such that light from the emitter can be selectively received by the receiver, said bottom having a back and sides defining a generally open interior, said back further defining an aperture being generally centered on said longitudinal axis of said shaft and a tubular extension generally surrounding said aperture and extending upward into said generally open interior toward a generally flat inside surface of said top immediately adjacent said shaft; and,
    a switch operator having a first end enclosed within said housing, a second end extending outwardly through said top of said housing and a cross-sectional dimension sized for snugly but slidably being received within said shaft such that said switch operator and said generally perpendicular light passage prohibit light or dust falling on said top from direct access to the optical switch, said switch operator further defining a circumferential flange having a diameter significantly greater than said cross-sectional dimension of said switch operator and a diameter of said aperture in said bottom, said circumferential flange being snugly but slidably received within said tubular extension such that light or dust entering through said aperture is prohibited from direct access to the optical switch.

2. A mechanical operator for an optical switch having light and dust resistant qualities, said operator comprising:
    a housing having a top and a bottom, said top defining a pair of spaced apart slots for receiving an emitter and a receiver of the optical switch and a generally tubular shaft passing between said pair of slots such that said longitudinal axes of said slots and said shaft are generally perpendicular to one another, said top further defining a light passage extending between said slots and through said shaft such that light from the emitter can be selectively received by the receiver, said bottom having a back and sides defining a generally open interior, said back further an aperture being generally centered on said longitudinal axis of said shaft and a tubular extension generally surrounding said aperture and extending upward into said generally open interior toward a generally flat inside surface of said top immediately adjacent said shaft; and,
    a switch operator having a first end enclosed within said housing, a second end extending outwardly through said top of said housing and a cross-sectional dimension sized for snugly but slidably being received within said shaft such that said switch operator is movable between a first position and a second position, said switch operator defining a window such that at one of said first or second positions light from the emitter can be received by the receiver and at the other of said first or second positions light from the emitter can not be received by the receiver, said switch operator further defining a circumferential flange having a diameter significantly greater than said cross-sectional dimension of said switch operator and a diameter of said aperture of said bottom, said circumferential flange being snugly but slidably received within said tubular extension, said switch operator in combination with said shaft and said light passage prohibiting light or dust falling on said top from direct access to the optical switch and said circumferential flange in combination with said tubular extension prohibiting light or dust entering through said aperture from direct access to the optical switch.

3. A mechanical operator for an optical switch having light and dust resistant qualities, said operator comprising:
    a housing having a top and a bottom, said top defining a pair of spaced apart slots dimensioned to receive an emitter and a receiver of the optical switch, a generally tubular shaft passing between said pair of slots and a light passage extending between said slots and through said shaft such that light from the emitter can be selectively received by the receiver, said light passage and said shaft arranged such that longitudinal axes of said light passage and said shaft are generally perpendicular to one another and intersect within said shaft, said bottom having a back and sides defining a generally open interior, said back further defining an aperture being generally centered on said longitudinal axis of said shaft of said top and a tubular extension generally surrounding said aperture and extending upward into said generally open interior toward a generally flat inside surface of said top immediately adjacent said shaft; and,
    a switch operator having a first end enclosed within said housing, a second end extending outwardly through said top and a cross-sectional dimension sized for snugly but slidably being received within said shaft such that said switch operator and said light passage, being generally perpendicular to said shaft, prohibit light or dust falling on said top portion from direct access to the optical switch, said switch operator further defining a circumferential flange having a diameter significantly greater than said cross-sectional dimension of said switch operator and a diameter of said aperture in said bottom, said circumferential flange being snugly but slidably received within said tubular extension such that light or dust entering through said aperture is prohibited from direct access to the optical switch.

4. A mechanical operator for an optical switch having light and dust resistant qualities, said operator comprising:
    a housing having a top and a bottom, said top defining a generally tubular shaft and a light passage being generally arranged such that longitudinal axes of said shaft and said light passage are perpendicular to one another and intersect in said shaft, said light passage arranged to permit the passage of light between an emitter and a receiver of the optical switch, said bottom having a back and sides defining a generally open interior, said back further defining an aperture generally of the same cross-sectional dimension as said shaft and being centered on said longitudinal axis of said shaft and a tubular extension generally surrounding said aperture and extending upward into said generally open interior; and, a switch operator having a first end enclosed within said housing, a second end extending outwardly through said top, said switch operator having a cross-sectional dimension sized for snugly but slidably being received within said shaft such that said switch operator and said light passage, being generally perpendicular to said shaft, prohibit light or dust falling on said top from direct access to the optical switch, said switch operator further defining a circumferential flange having a diameter significantly greater than said cross-sectional dimension of said switch operator and a diameter of said aperture in said bottom, said circumferential flange being snugly but slidably received within said tubular extension such that light or dust entering through said aperture is prohibited from direct access to the optical switch.

5. A mechanical operator for an optical switch having light and dust resistant qualities, said operator comprising:

a housing defining a generally open interior accessible through a tubular shaft and an aperture, said shaft and said aperture having a common axis and being spaced apart one from the other, said housing further defining a light passage being arranged such that longitudinal axes of said shaft and said light passage are perpendicular to one another and intersect within said shaft, said light passage arranged to permit the passage of light between an emitter and a receiver of the optical switch, said housing further defining a tubular extension generally surrounding said aperture and extending upward into said generally open interior; and, a switch operator having a cross-sectional dimension sized for snugly but slidably being received within said shaft and having a first end enclosed within said housing and a second end extending outwardly through said shaft, said switch operator snugly received within said shaft and said light passage, being generally perpendicular to said shaft, prohibit light or dust falling on said housing adjacent said second end of said switch operator from direct access to the optical switch, said switch operator further defining a circumferential flange adjacent said first end, said circumferential flange having a diameter significantly greater than said cross-sectional dimension of said switch operator and a diameter of said aperture, said circumferential flange being snugly but slidably received within said tubular extension such that light or dust entering through said aperture is prohibited from direct access to the optical switch.

* * * * *